United States Patent [19]

Yamaguchi

[11] Patent Number: 4,682,402

[45] Date of Patent: Jul. 28, 1987

[54] SEMICONDUCTOR DEVICE COMPRISING POLYCRYSTALLINE SILICON RESISTOR ELEMENT

[75] Inventor: Yasutaka Yamaguchi, Tokyo, Japan

[73] Assignee: NEC Corporation, Japan

[21] Appl. No.: 610,827

[22] Filed: May 15, 1984

[30] Foreign Application Priority Data

May 16, 1983 [JP] Japan .................................. 58-85280

[51] Int. Cl.$^4$ .................. H01L 21/441; H01L 29/04
[52] U.S. Cl. ...................................... 29/571; 29/591;
148/DIG. 136; 357/59
[58] Field of Search ................. 29/571, 578, 580, 591;
148/1.5, DIG. 8, DIG. 122; 357/4, 23 TF, 59,
71; 156/643, 644, 648

[56] References Cited

U.S. PATENT DOCUMENTS

| | | | |
|---|---|---|---|
| 3,364,085 | 1/1968 | Dahlberg | 148/DIG. 122 X |
| 4,270,262 | 6/1981 | Hori et al. | 29/571 |
| 4,278,989 | 7/1981 | Baba et al. | 357/59 |
| 4,317,274 | 3/1982 | Yasunari | 357/59 X |
| 4,380,773 | 4/1983 | Goodman | 357/59 X |
| 4,441,249 | 4/1984 | Alspector et al. | 357/59 X |
| 4,477,962 | 10/1984 | Godejahn | 357/59 X |

Primary Examiner—Olik Chaudhuri
Attorney, Agent, or Firm—Laff, Whitesel, Conte & Saret

[57] ABSTRACT

This invention relates to a semiconductor device having a resistor element of polycrystalline silicon and method of manufacturing the device. The resistor element comprises a first conductive layer made of a first polycrystalline silicon layer and island-like second conductive members made of a second polycrystalline silicon layer and provided on end sections of the first conductive layer respectively. The resistance value of the resistor element is determined by a center section between the end sections of the first conductive layer. Therefore, high resistance value can be obtained by decreasing the thickness of the first conductive layer, or the center section thereof without sacrificing the degree of integration. On the other hand, the contact portions with wiring layers become a large thickness because they are composed of the end sections of the first conductive layer and the island-like second conductive member. Therefore, a good and reliable contact structure can be obtained in the resistor element having high resistance value.

3 Claims, 14 Drawing Figures

SEMICONDUCTOR DEVICE COMPRISING POLYCRYSTALLINE SILICON RESISTOR ELEMENT

BACKGROUND OF THE INVENTION

The present invention relates to a semiconductor device and a method of manufacturing the same, and more particularly to a resistor element made of polycrystalline silicon on a field insulating film formed on a major surface of a semiconductor substrate and a method of manufacturing the resistor element.

Normally, a resistance R and a sheet resistance $R_s$ of a resistor element are determined by a width W, a length L, a thickness t and a specific resistance $\rho$ of the resistor element and represented by the following formulae:

$$R = \frac{L}{W \cdot t} \cdot \rho \quad (1)$$

$$R_s = \frac{\rho}{t} \quad (2)$$

Therefore, the following three methods are conceived to obtain a resistor element having a high resistance.

According to a first method, a plan configuration, that is, a width and a length of a resistor element are designed so as to obtain a high resistance. In this method, while a width W of a resistor element can be made small up to a lower limit of a resolution of a photo-resist process, there are shortcomings that if design close to the lower limit is effected, fluctuations of the manufacturing conditions would become large and hence resistor elements having a stable resistance cannot be obtained. On the other hand, if a resistor element is formed by making a length L of the resistor element large, a degree of integration cannot be raised.

According to a second method, a specific resistance of a resistor element is raised. However, a semiconductor layer normally used in a semiconductor device for forming a resistor element is used at the other portions of the device as wirings, gate electrodes, etc., and in view of the objects of use of these portions it is desirable to reduce the specific resistance as low as possible. Accordingly, in order to raise the specific resistance of the resistor element per se, it is necessary to add a manufacturing step of process for forming only the resistor element. However, an addition of a manufacturing step of process is associated with shortcomings that it brings about rise of the cost, also defects are liable to occur and hence the yield is lowered.

According to a third method, a resistor element having high resistance can be formed by thinning a thickness of a semiconductor layer which makes the resistor element. However, when apertures for leading out electrodes are opened in an inter-layer insulating film or an upper insulating film formed above the resistor element, etching would be effected up to the silicon layer of the resistor element, resulting in formation of apertures in the layer. This becomes an issue especially when a reactive ion etching process in which anisotropic etching is possible, is employed for micro-fine patterning. Therefore, thinning of the thickness of the silicon layer of the resistor element is subjected to certain limitation.

In more particular, when a polycrystalline silicon is used, in the case of a film thickness of 2000 Å or smaller, possibly apertures would be opened also in the contact sections of this resistor element in the above-mentioned step of process, although it may depend upon reaction conditions of the etching. Hence, contact structures having a poor reliability would result. Namely, when the apertures are formed in a silicon oxide film, for example, above the contact sections of the polycrystalline silicon resistor by the anisotropic reactive ion etching, $CF_4$ and $H_2$ gases are employed under the condition of 4 to 8 Pa (pascal) pressure. In this case, the etching rate of thermal silicon oxide is 200 to 300 Å/min., the rate of CVD silicon oxide is 400 to 500 Å/min. and the rate of polycrystalline silicon is 100 to 150 Å/min. The deviation of the respective etching rate becomes 20 to 40% in a reactor chamber. In view of such a small ratio of the etching rates of silicon oxide and polycrystalline silicon and of the deviation in the chamber, it is impossible to obtain a reliable contact structure when the polycrystalline silicon has a thin thickness in its contact sections.

In practice, in order to obtain contact structures having a sufficient reliability through the above-mentioned method, a film thickness of 5000 Å or larger is necessitated. On the other hand, it is not practical to use the method in which a thick polycrystalline silicon layer such as, for example, of a layer of 6000 to 8000 Å in thickness is formed and in which only the central section serving as a resistor section is etched except for the contact sections.

More particularly, in this case, in order to form a resistor section of 2000 Å in thickness, a thickness that is as thick as 4000 to 6000 Å must be removed by etching. However, if a resistor section having a small film thickness is produced by such a etching method, a uniformity within the resistor section would become very poor. Deviations in the film thickness of the resistor sections among the respective pellets or wafers would also become very large. In addition, in the case of employing such method, a long etching time is necessitated.

An etching amount of such extent that the above-mentioned uniformity and deviations would not become an issue, is 2000 Å at the maximum. Taking the above-mentioned problems into consideration, in the prior art it was impossible to manufacture a resistor element having a film thickness of 2000 Å or smaller with a good reliability.

SUMMARY OF THE INVENTION

It is therefore one object of the present invention to provide a semiconductor device having an improved degree of integration and including a resistor element having a small deviation in a high resistance and stable electrode lead-out structure.

Another object of the present invention is to provide a method for manufacturing a semiconductor device in which the above-referred semiconductor device can be obtained without increasing steps of the manufacturing process.

According to one feature of the present invention, there is provided a semiconductor device comprising a semiconductor substrate. A first insulating film such as a field silicon oxide film is formed on a major surface of the semiconductor substrate, a resistor element being formed on the first insulating film. The resistor element includes a first conductive layer made of a first silicon layer such as a polycrystalline silicon layer and having a resistor section for determining the resistance value of the resistor element. At least one contact section is adjacent to the resistor section and a second conductive layer made of a second silicon layer such as a polycrystalline silicon layer and is positioned on the contact section of the first conductive layer. A second insulating film such as silicon oxide film or P.S.G. film covers the first and second conductive layers and has an aperture reaching the surface of the second conductive layer. An electrode wiring layer connected to the surface of the said second conductive layer through the aperture and extends to the second insulating film. The thickness of the first conductive layer, especially that of the resistor section is favorably 2000 Å or less. In the first conductive layer, the upper surface of the resistor section may be lower than the upper surface of the contact section by favorably 2000 Å or less. The shape of the second conductive layer may be island-like, and the total thickness of the second conductive layer and the contact section of the first conductive layer is favorably 5000 Å or more. The first and second conductive layers of the resistor element can be made with electrodes or wiring layers of the other element in the same semiconductor substrate.

According to another feature of the present invention, a semiconductor device comprises a semiconductor substrate. A first insulating film is selectively formed on a major surface of the substrate. An active region of the substrate is adjacent to the field insulating film. A resistor element is provided on the field insulating film. A stacked-gate field effect transistor, namely an erasable programmable read-only memory element (hereinafter abbreviated as EPROM element), is provided on the active region. The resistor element includes a first conductive layer made of a first polycrystalline silicon layer and has a resistor section for determining the resistance of the resistor element and a contact section adjacent to the resistor section. A second conductive layer is made of a second polycrystalline silicon, positioned on said contact section of the first conductive layer and having an island-shaped plan configuration. The EPROM element includes a floating gate electrode made of the first polycrystalline silicon layer and a control gate electrode made of the second polycrystalline silicon layer.

According to another aspect of the present invention, there is provided a method of manufacturing a semiconductor device comprising the steps of forming a first insulating film on a semiconductor substrate, forming a first polycrystalline silicon pattern on the first insulating film, forming a island-like pattern of a second polycrystalline silicon on a predetermined portion of the first polycrystalline silicon pattern, covering a second insulating film over the first and second polycrystalline silicon, opening an aperture reached to the island-like pattern of the second polycrystalline silicon in the second insulating film by a reactive ion etching method, and forming a wiring layer in contact with the upper surface of the island-like pattern through said aperture. A portion of the first polycrystalline silicon pattern adjacent to the predetermined portion may be reduced by 2000 Å or less, after forming the first polycrystalline silicon pattern on the first insulating film.

The first and second polycrystalline silicon may be used as a resistor element. In this case, the resistance of the resistor element is determined by a portion of the first polycrystalline silicon pattern on which the island-like second polycrystalline silicon is not provided. The thickness of the portion used as the resistor section is favorably 2000 Å or less to obtain high resistance without sacrificing the degree of integration. The sum of the thickness of the predetermined portion of the first polycrystalline and that of the second polycrystalline is favorably 5000 Å more to obtain a reliable contact structure.

As described above, according to the present invention, a second conductive layer is provided on the contact sections of the thin first conductive layer. The apertures for contacts in the second insulating film are provided so as to reach the surface of the second conductive layer. Accordingly, upon opening the contact apertures in the second insulating film, an accident would not occur such that undesired apertures may be opened in the first conductive layer which was made thin for the purpose of realizing a high resistance. The electrode wiring layer for making ohmic contact with the second conductive layer can be formed of a metallic layer made of aluminium or the like.

In addition, a floating gate in EPROM element provided in another portion of the semiconductor device can be formed in the same step of process as the first conductive layer. In other words, no problem would arise even if the conductive layer is formed to have a thin film thickness for the purpose of increasing the sheet resistance $R_s$ of the resistor and is used as a floating gate in an EPROM element. On the other hand, a control gate electrode of the above-mentioned EPROM element, or a gate electrode of a conventional insulated gate field effect transistor (hereinafter abbreviated as IGFET) or wiring layers to be directly connected to impurity regions provided in a semiconductor substrate and serving as a source and a drain in the IGFET, can be formed simultaneously with formation of the above-described second conducting layer.

This second conductive layer can be thick because it is irrelevant to the enhancement of a resistance of the resistor. On the other hand, since the wiring layer can be advantageously formed thick in order to realize a low resistance, the thickness of the second conductive layer, control gate electrodes and wiring layers can be made thick, taking into consideration the easiness of the pattering. Also, simultaneously with a formation of the electrode wiring layers to be connected to the second conductive layer, the metallic wiring layer to be connected to the control gate electrodes and the wiring layer to be connected to the impurity regions in the semiconductor substrate can be formed. Furthermore, the first conductive layer can be converted into a resistor having a further high resistance by partly etching away the first conductive layer within the range of 2000 Å or smaller in depth as measured from its surface as mentioned above. In the case of etching away within the range of 2000 Å or smaller in depth, the deviation of a film thickness and the uniformity among the produced resistors would not become an issue.

DETAILED DESCRIPTION OF THE PRIOR ART

Figure 1:
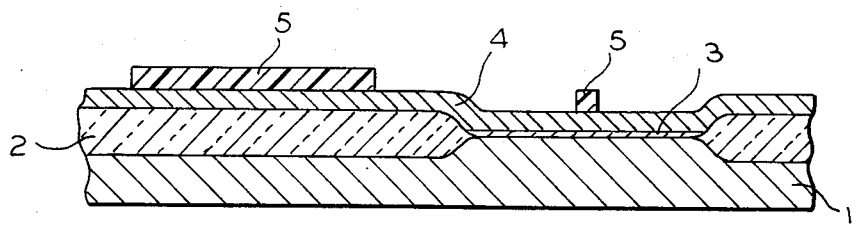
FIGS. 1A through 1E are cross-sectional views showing successive steps in a method of manufacturing a semiconductor device in the prior art.
Figure 1:
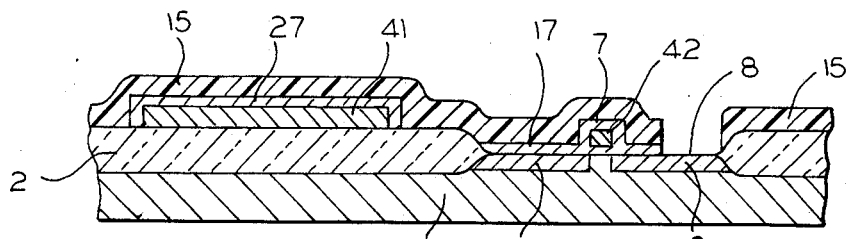
Figure 1:
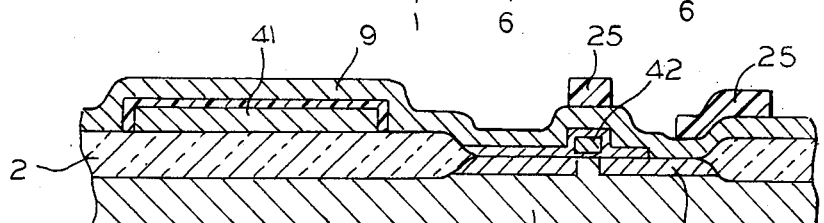
Figure 1:
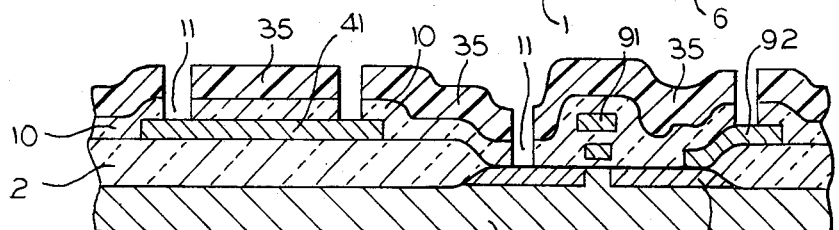
Figure 1:
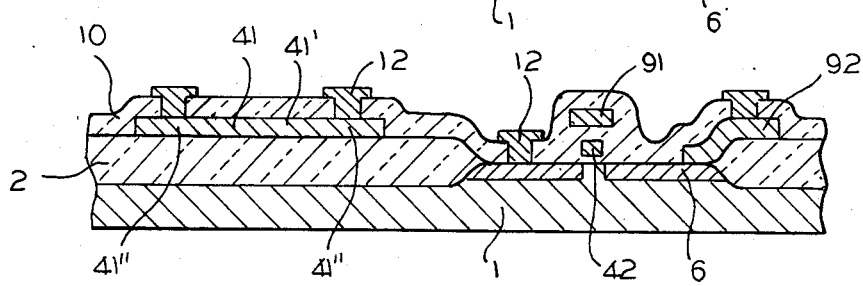

Now description will be made on a method of manufacturing a semiconductor device in the prior art with reference to FIGS. 1A through 1E and FIG. 2, in which it is assumed that a resistor element having high resistance is manufactured jointly with an IGFET, especially with an EPROM element, by increasing a length L of the resistor element. Similarly to the case of manufacturing the known N-channel IGFET, after a thick field oxide film 2 for isolating elements has been grown on a P-type semiconductor substrate 1 as buried in the substrate, a first gate insulating film 3 is formed. Subsequently, after ion-implantation of a P-type impurity for threshold control such as, for instance, boron has been carried out in a device forming region if necessary, a first polycrystalline silicon layer 4 is grown, then a photo-resist 5 is deposited and pattering is carried out (FIG. 1A).

Then the first polysilicon layer 4 is etched by employing the photo-resist 5 as a mask, and thereby a resistor element 41 and a first gate electrode 42 which serves as a floating gate, are formed. Thereafter, an N-type impurity is ion-implanted to form source and drain regions 6, and a second gate insulating film 7 is formed by thermal oxidation. At this moment, a silicon oxide film 27 of about 500 Å thickness is also formed on the surface of the resistor element 41, and on the source and drain regions 6 is also formed a silicon oxide film 17 that is thicker than the first gate insulating film 3. Subsequently, the silicon oxide film 17 at a buried contact portion 8 is removed by making use of the photo-resist 15 as a mask (FIG. 1B).

Next, an N-type second polycrystalline silicon layer 9 to be converted into a second gate electrode serving as a control gate and a lead-out wiring layer, is formed, and is subjected to patterning after a photo-resist 25 has been deposited thereon (FIG. 1C).

Subsequently, after a second gate electrode 91 and a lead-out electrode 92 have been formed by etching the second polycrystalline silicon layer 9, an insulating film 10 made of silicon dioxide or the like is grown above the electrodes 91 and 92, for instance, through a CVD process, and then predetermined apertures 11 are formed by a reactive ion etching process (FIG. 1D). It is to be noted that in FIGS. 1D and 1E the silicon oxide films 27 and 17 are depicted as included in the insulating film 10.

Figure 2:
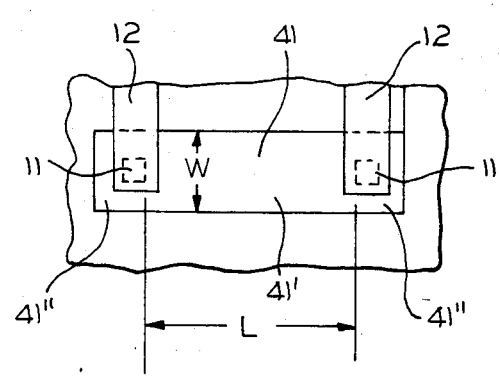
FIG. 2 is a plan view showing the portion of a resistor element shown in FIG. 1E, FIGS. 3A through 3E are cross-sectional views showing successive steps in a method of manufacturing a semiconductor device according to a first preferred embodiment of the present invention.

Then, electrode wirings 12 are formed by depositing aluminium and pattering the aluminum layer, and thereby a semiconductor device including a resistor and an EPROM element is completed (FIGS. 1E and 2).

Here, it is to be noted that the sheet resistance $R_s$ of the resistor element 41 and the floating gate 42 in FIGS. 1E and 2 is about 150~50 $\Omega/\square$ and the film thickness in the illustrated embodiment is about 6000 Å. In this instance, if an impurity concentration of the first polycrystalline silicon layer 4 is lowered and thereby the sheet resistance $R_s$ is made large for the purpose of forming a high resistance resistor element, then the phenomenon that a withstand voltage of the second gate insulating film 7 formed on the first gate electrode 42 (floating gate) is lowered, would arise, and therefore, it is not favorable to lower the impurity concentration merely for the purpose of increasing the sheet resistance $R_s$.

With regard to the method of increasing the sheet resistance $R_s$ by thinning the thickness of the first polycrystalline silicon layer 4, although it brings about no problem for the EPROM element, according to this method, in some cases, when the apertures 11 are oepned in the insulating film 10 deposited on the resistor element 41 as shown in FIG. 1D, the first polycrystalline silicon layer forming the resistor element is also party etched and thus the resistor element 41 would disappear. This phenomenon the the first polycrystalline silicon layer is etched away, has become to be generated recently after the micro-fine designing of the devices was required and the reactive ion etching apparatus which can achieve anisotropic etching began to be used as an etching apparatus for the apertured portions. This is caused by the fact that the selective etching ratio of the insulating film to the polysilicon layer is low. As described above, according to the method of forming a high resistance resistor element by thinning the first polycrystalline silicon layer, upon forming the apertured portions the polycrystalline silicon layer would disappear and hence it becomes impossible to lead out the electrodes.

From the above-mentioned reasons, in the prior art in order to form a resistor having high resistance, the method of selecting the ratio of the length L to the width W of the resistor element at a large ratio has been employed, but in the manufactured semiconductor device, a degree of integration would be low and fluctuations of the resistances would become large. In more particular, in the resistor element 41 shown in FIG. 2, the resistor section 41' between the contact section 41" determines the resistance value and contact sections 41" are located on the opposite sides of the resistor section 41'. According to this technique in the prior art, since the film thickness of the resistor element was compelled to the selected thicker than 5000 Å, the length L of the resistor section 41'of the resistor element 41 had to be chosen long.

DESCRIPTION OF PREFERRED EMBODIMENTS

First Preferred Embodiment

The successive steps are almost similar to the respective steps of the method of manufacture in the prior art illustrated in FIGS. 1A through 1E.

Figure 3A:
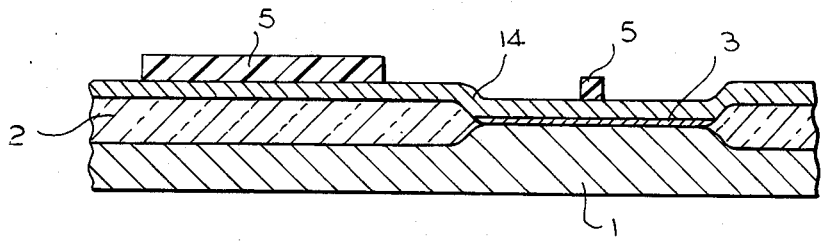

At first, after a silicon oxide film 2 as a field insulating film for isolating elements has been grown on a P-type semiconductor substrate 1, a first gate insulating film 3 is formed. Next, after ion-implantation of a P-type impurity for threshold control, if necessary, has been carried out in an element forming region, a first polycrystalline silicon layer 14 of 1300 Å thickness is grown, then a photo-resist 5 is deposited thereon and patterning is effected therefor. The layer 14 has the same impurity density of N type that of the layer 4 in FIG. 1. (FIG. 3A).

Figure 3B:
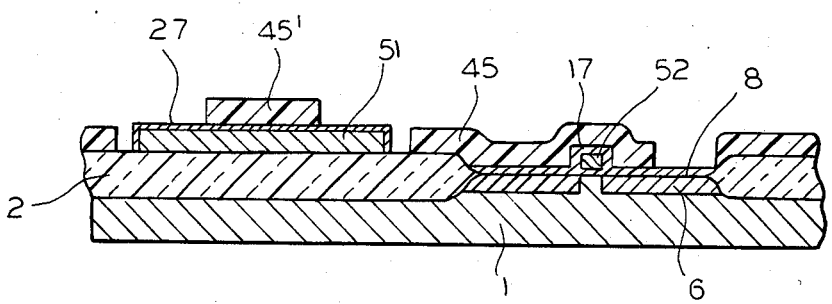

Subsequently, a portion 51 serving as a resistor element and a first gate electrode 52 serving as a floating gate are formed by etching the first polycrystalline silicon layer 14, and thereafter an N-type impurity is introduced by ion-implantation to form source and drain regions 6. Then, a second gate insulating film 17 is formed on the upper surface and side surfaces of the first gate electrode 52 by thermal oxidation, and at the same time a thermally oxidized film 27 of 600 Å thickness is formed also on the upper surface and side surfaces of the resistor portion 51. Then the thickness of the first gate electrode 52 and that of the resistor portion 51 become 1000 Å. Next, photo-resists 45 and 45' which have been subjected to patterning, are formed (FIG. 3B).

Figure 3C:
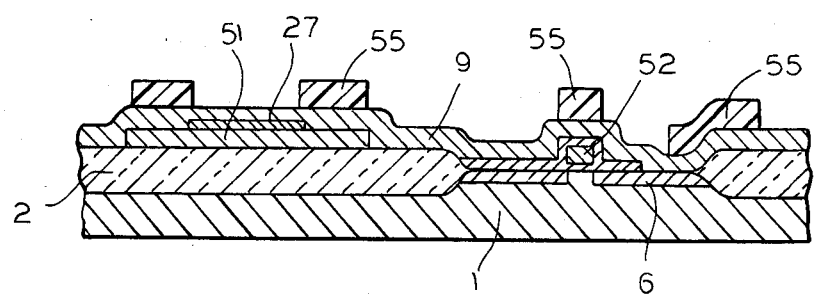

In the next step, etching is carried out by employing these photo-resists 45 and 45' as a mask to remove the thermally oxidized silicon film on a buried contact 8 and also to remove the opposite end parts of the thermally oxidized silicon film 27 on the resistor portion 51, which parts are not coated with the photo-resist 45'. The length of this photo-resist 45' and hence the length of the remaining silicon oxide film 27 would define the length of the resistor section which determines the resistance value of the resistor element. Next, a second polycrystalline silicon layer 9 of N-type having a thickness of 4000 to 8000 Å is formed, then a photo-resist 55 is deposited thereon and patterning is carried out (FIG. 3C).

Figure 3D:
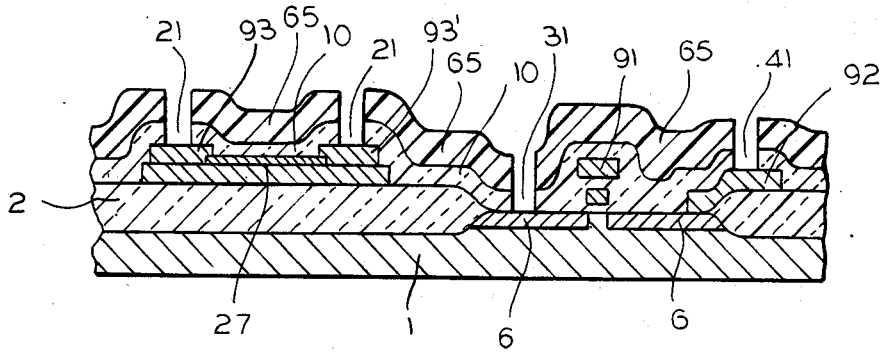

Subsequently, the second polycrystalline silicon layer 9 is subjected to etching by making used of the photoresist 55 as a mask to form a second gate electrode 91 serving as a control gate, a lead-out wiring layer 92 and island-like layers 93 and 93'. During this step, the silicon oxide film 27 remaining on the resistor portion 51 is used as a stopper for preventing the first polycrystalline silicon layer of the resistor portion 51 formed very thin from being etched. Namely, when the second polycrystalline silicon layer is etched by the anisotripic reactive ion etching, one or two kind of gases selected from a group consisting of $CCl_4$, $CClF_3$, $CCl_2F_2$ and $CCl_3F$ gases is employed with $O_2$ gas or $N_2$ gas under the condition of 10 to 50 Pa (pascal) pressure. In this case, the etching rate of polycrystalline silicon is 500 to 1500 Å/min., whereas the etching rate of thermal silicon oxide is only 20 Å/min. In view of such a large ratio of the etching rates of polycrystalline silicon and silicon oxide, the silicon oxide film 27 can be effectively used as an etching stopper film. Subsequently, an insulating film such as, for example, a silicon dioxide film 10 of 7000 Å in thickness deposited through a CVD process is grown, then a photoresist 65 is deposited thereon, and the silicon dioxide film 10 is etched by making use of this photo-resist 65 as a mask to form apertures 21, 31 and 41. Formation of these apertures is effected through anisotropic etching by means of a reactive ion etching apparatus (FIG. 3D).

Figure 3E:
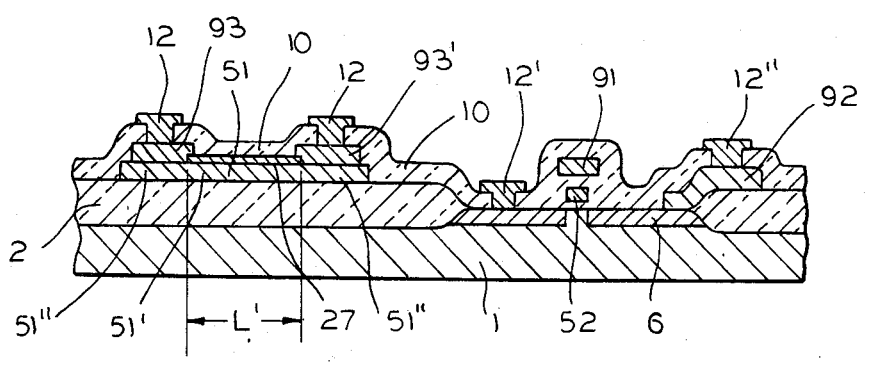

Next, metallic wiring layers 12, 12' and 12" connected to the respective portions and extending on the silicon dioxide film are formed by depositing aluminium and patterning the aluminium layer. In this way, a semiconductor device including a resistor and an EPROM element is completed (FIGS. 3E and 4).

Here, it is to be noted that the resistor element according to the above-described embodiment comprises the first polycrystalline silicon layer 51 including resistor section 51' and contact sections 51" and resistor lead-out electrodes, that is, island-like layers 93 and 93' made of the second layer. And the central section 51' of the first polycrystalline layer 51, that is, the resistor section having a length L' determines the resistance value, while the opposite end sections, that is contact sections 51" of the first polycrystalline silicon layer 51 and the island-like electrodes 93 and 93' thereon jointly form contact structure. The impurity concentration and the width W of the resistor in FIG. 3 are identical to those shown in FIG. 1. Accordingly, in order to realize the same resistance value as that of the resistor in the prior art as illustrated in FIG. 1, the length L' of the resistor section according to the present invention can be reduced to about 1/6 times the length L of the resistor section of the resistor element shown in FIG. 1, and hence according to the present invention, a degree of integration can be enhanced. On the other hand, since the first and second polycrystalline silicon layers are present under the apertures 21 and the thickness of the both layers amounts to about 5000 to 9000 Å in total, even if the surface of these polycrystalline layers should be etched upon etching the above-mentioned apertures, connection having an improved reliability can be realized. Moreover, as the resistor lead-out electrodes 93 and 93' can be formed simultaneously with formation of the second gate electrode 91 and the lead-out wiring layer 92 by etching the second polycrystalline silicon layer 9, there is no need to add a special stepand the of the process.

Second Preferred Embodiment

Figure 4:
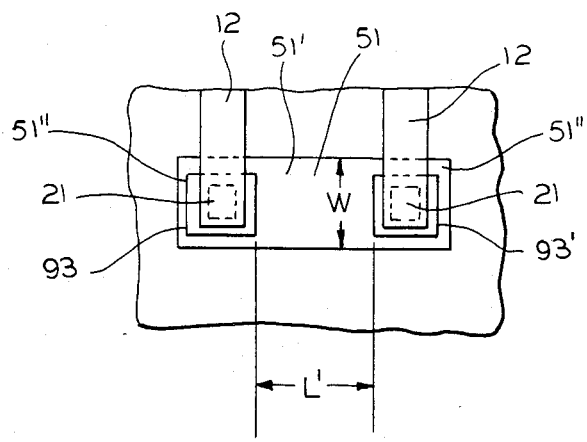
FIG. 4 is a plan view showing the portion of resistor element in FIG. 3E.
Figure 5A:
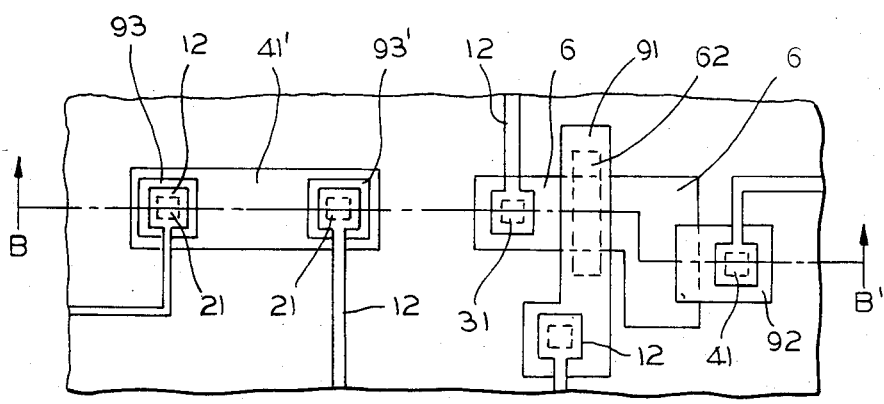
FIG. 5A is a plan view showing a second preferred embodiment of the present invention.
Figure 5B:
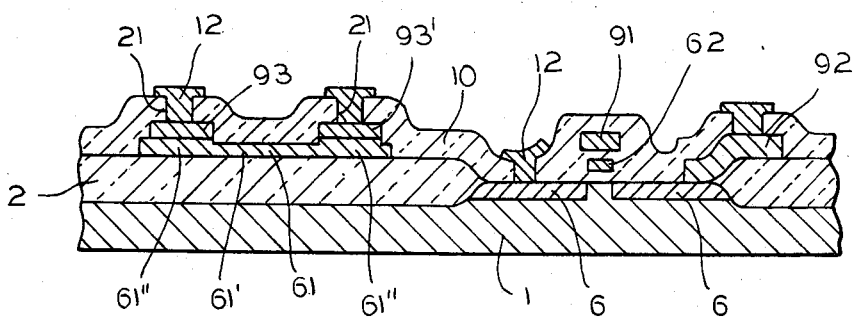
FIG. 5B is a cross-sectional view taken along line B-B' in FIG. 5A as viewed in the direction of arrows.

In the second preferred embodiment shown in FIGS. 5, component parts having the same functions as those in the first preferred embodiment shown in FIGS. 3 and 4 are given like reference numerals. It is to be noted that in FIG. 5A an insulating film 10 is omitted from illustration for the purpose of clarification of the structure.

According to this modified embodiment, the photo-resist 45' is not provided in the step shown in FIG. 3B, and thereby the silicon dioxide film 27 is entirely removed. Thereafter, the opposite end portions of the resistor serving as contact sections are masked by photo-resists, also other portions are masked, and etching is carried out with only the center section which determines the resistance value exposed to make this portion thinner. More particularly, the first polycrystalline silicon layer before this etching has a thickness of 3000 Å. In this polycrystalline silicon layer, only the central section which is later converted into a resistor section is exposed, then preferably reactive and anisotropic etching is carried out to remove out a thickness part of 1500 Å. Accordingly, the thickness of the remaining layer becomes 1500 Å. As described previously, even if such removal by etching of the polycrystalline silicon layer is carried out up to 2000 Å in depth, the deviations among the respective resistor elements can be disregarded. Subsequently, after an insulating film having an anti-etching property against a etching for polycrystalline silicon is deposited on the section subjected to this removal by etching, a second polycrystalline layer is deposited. Thereafter, similarly to the step shown in FIG. 3C and the subsequent steps in the first preferred embodiment, the second polycrystalline layer is patterned. The previously deposited insulating film, such as a silicon dixoide file that is, the insulating film deposited on the thinned portion of the first polycrystalline layer as a etching stopper during this etching, could be either removed or retained in itself. FIG. 5 shows the case where after this insulating film was removed a silicon dioxide film 10 has been deposited through a CVD process. In this way, the semiconductor device shown in FIG. 5 can be obtained. Accordingly, in the first polycrystalline silicon layer 61 forming the resistor element, the thickness of the resistor section 61' at the center which determines the resistance value becomes 1500 Å, while the thickness of the contact section 61" at its opposite ends and the thickness of the floating gate 62 are 3000 Å. In this modified embodiment also, under the apertures 21 in the inter-layer insulating layer 10 are present the island-like electrodes 93 and 93' consisting of the second polycrystalline layer of 4000 to 8000 Å in thickness, and under the electrodes are present contact sections 61" consisting of the first polysilicon layer of 3000 Å in thickness, so that even if the above-mentioned apertures 21 are opened by reactive and anisotropic ion etching, contact structures having a high reliability can be obtained. The above-mentioned modified embodiment is employed in the case where the first polycrystalline layer is used at the other portions with the thickness increased to a certain extent.

While the preferred embodiments of the present invention have been described above, by way of example, in connection to an N-channel EPROM element, the invention is equally applicable to a P-channel/N-channel complementary type semiconductor device having two or more conductive layers. As a matter of course, the second polycrystalline silicon can be used for a gate electrode in the conventional IGFET.

As described in detail above, according to the present invention, a semiconductor device including a high resistance resistor element and having an improved degree of integration as well as a method for manufacturing such a semiconductor device can be obtained.

What is claimed is:

1. A method of manufacturing a semiconductor device having a polycrystalline silicon resistor element, said method comprising the steps of forming a first insulating film on a semiconductor substrate, forming a first conductive layer made of a first polycrystalline silicon pattern on said first insulating film for providng said resistor element, forming an island-like pattern of a second polycrystalline silicon layer on a first portion of said first polycrystalline silicon pattern, forming a second insulating film over said first and second polycrystalline silicon layers, opening an aperture in said second insulating film by a reactive ion etching step to expose a part of said island-like pattern of said second polycrystalline silicon layer, forming a wiring layer in contact with the upper surface of said island-like pattern, through said aperture and controlling the resistance of said first conductive layer by reducing the thickness of a portion of said first polycrystalline silicon pattern adjacent to said first portion after forming said first polycrystalline silicon pattern on said first insulating film.

2. A method of manufacturing a semiconductor device comprising a resistor element including a resistor portion for determining the resistance value of said resistor element and contact portion adjacent to said resistor portion, said method comprising the steps of forming a first insulating film on a semiconductor substrate, forming a first polycrystalline silicon pattern on said first insulating film, said first polycrystalline silicon pattern having a first section and a second section adjacent to said first section, forming a first mask pattern on said second section, etching said first section from its upper surface to reduce its thickness, removing said first mask to expose the upper surface of said second section, forming a second mask on the etched first section with reduced polycrystalline silicons, opening an aperature in said second thickness of said first polycrystalline silicon pattern, forming an island-like pattern of a second polycrystalline silicon in contact with the exposed upper surface of said second section of said first polycrystalline silicon pattern, forming a second insulating film over sad first and second insulating film to expose a part of said island-like pattern of said second polycrystalline silicon, and forming a wiring layer to make contact with the upper surface of said island-like pattern through said aperture, whereby said etched first section with a reduced thickness of said first polycrystalline silicon pattern is used as said resistor portion of said resistor element, and said second section of said first polycrystalline silicon pattern and said island-like pattern of said second polycrystalline silicon are used as said contact portions of said resistor element.

3. A method of claim 2, in which said first section of said first polycrystalline silicon pattern is etched away to a maximum thickness of 2000 Å, measured from its upper surface.

* * * * *